(12) United States Patent
Yeom et al.

(10) Patent No.: US 11,848,500 B2
(45) Date of Patent: Dec. 19, 2023

(54) ELECTRONIC DEVICE HAVING FPCB

(71) Applicant: SAMSUNG ELECTRONICS CO., LTD., Suwon-si (KR)

(72) Inventors: Junghwan Yeom, Suwon-si (KR); Youngjong Kim, Suwon-si (KR); Sungwon Park, Suwon-si (KR); Handug Lee, Suwon-si (KR); Jongwoo Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 373 days.

(21) Appl. No.: 16/941,643

(22) Filed: Jul. 29, 2020

(65) Prior Publication Data

US 2021/0036434 A1 Feb. 4, 2021

(30) Foreign Application Priority Data

Aug. 2, 2019 (KR) .................... 10-2019-0094597

(51) Int. Cl.
*H01Q 1/24* (2006.01)
*H01Q 21/06* (2006.01)
*H01Q 21/00* (2006.01)

(52) U.S. Cl.
CPC .......... *H01Q 21/065* (2013.01); *H01Q 1/243* (2013.01); *H01Q 21/0025* (2013.01)

(58) Field of Classification Search
CPC .. H01Q 21/065; H01Q 1/243; H01Q 21/0025; H01Q 3/38; H01Q 21/28; H01Q 1/50; H01R 12/77; H05K 1/118
See application file for complete search history.

(56) References Cited

U.S. PATENT DOCUMENTS 8,115,103 B2 * 2/2012 Tokuyama ............. H05K 1/118
174/254
11,490,515 B2 * 11/2022 Iwasaki .................. H05K 1/144
(Continued)

FOREIGN PATENT DOCUMENTS

JP       2006108476 A  *  4/2006  ............. H04M 1/02
KR   10-2006-0089466       8/2006
(Continued)

OTHER PUBLICATIONS

Extended European Search Report dated Jun. 15, 2022 for EP Application No. 20849881.6.
(Continued)

*Primary Examiner* — Hai V Tran
*Assistant Examiner* — Bamidele A Immanuel
(74) *Attorney, Agent, or Firm* — Nixon & Vanderhye P.C.

(57) ABSTRACT

Disclosed is an electronic device. The electronic device includes: a housing including at least a part of a lateral surface of the electronic device; a printed circuit board (PCB) disposed in the housing; at least one wireless communication circuit disposed on the PCB; a first antenna module including at least one antenna disposed in a first region inside the housing; a second antenna module including at least one antenna disposed in a second region inside the housing; a third antenna module including at least one antenna disposed in a third region inside the housing; a first flexible printed circuit board (FPCB) connecting the first antenna module to the at least one wireless communication circuit; and a second FPCB connecting the second antenna module and the third antenna module to the at least one wireless communication circuit. The second FPCB includes: a first connector disposed on the PCB and electrically connected to the wireless communication circuit; a second connector coupled to a second joint electrically connected to
(Continued)

the second antenna module; a third connector coupled to a third joint electrically connected to the third antenna module; and a coupler connecting the first connector, the second connector, and the third connector.

12 Claims, 7 Drawing Sheets

(56) References Cited

U.S. PATENT DOCUMENTS

| | | | | |
|---|---|---|---|---|
| 2002/0135993 | A1* | 9/2002 | Ueyama | H04M 1/0216 |
| | | | | 361/752 |
| 2002/0149914 | A1* | 10/2002 | Karasawa | H05K 1/0266 |
| | | | | 349/52 |
| 2008/0287005 | A1* | 11/2008 | Kameda | G06F 1/184 |
| | | | | 439/498 |
| 2010/0016039 | A1* | 1/2010 | Tokuyama | H05K 1/118 |
| | | | | 29/830 |
| 2010/0240327 | A1* | 9/2010 | Lambrecht | H01Q 1/243 |
| | | | | 343/702 |
| 2010/0294556 | A1* | 11/2010 | Chuo | H05K 1/028 |
| | | | | 174/268 |
| 2011/0127069 | A1 | 6/2011 | Lin | |
| 2011/0176462 | A1* | 7/2011 | Kim | H01Q 1/246 |
| | | | | 370/328 |
| 2012/0252260 | A1* | 10/2012 | Tseng | H01R 12/62 |
| | | | | 439/499 |
| 2014/0225806 | A1* | 8/2014 | Lee | H01Q 1/243 |
| | | | | 343/905 |
| 2015/0192482 | A1* | 7/2015 | Araki | G01L 1/2287 |
| | | | | 73/862.627 |
| 2015/0282300 | A1 | 10/2015 | Kagaya et al. | |
| 2017/0358847 | A1* | 12/2017 | Cho | H01Q 5/35 |
| 2018/0323497 | A1 | 11/2018 | Kang et al. | |
| 2019/0158154 | A1* | 5/2019 | Na | H04B 1/00 |
| 2019/0165454 | A1* | 5/2019 | Lee | H01Q 21/067 |
| 2019/0166713 | A1* | 5/2019 | Chen | H01R 12/7076 |
| 2019/0319341 | A1* | 10/2019 | Park | H01Q 21/065 |
| 2020/0028949 | A1* | 1/2020 | Kim | H01Q 1/38 |
| 2020/0036083 | A1* | 1/2020 | Kim | H01Q 21/08 |
| 2020/0127404 | A1* | 4/2020 | Seo | H01R 12/775 |
| 2020/0389213 | A1* | 12/2020 | Lee | H04B 7/0617 |
| 2020/0396871 | A1* | 12/2020 | Yun | G06F 1/1626 |
| 2021/0235576 | A1* | 7/2021 | Nagai | H05K 1/0237 |

FOREIGN PATENT DOCUMENTS

| | | | |
|---|---|---|---|
| KR | 102439813 B1 * | 5/2018 | .......... H04M 1/0249 |
| KR | 10-2019-0038264 | 4/2019 | |
| WO | WO 2009/029520 A1 | 3/2009 | |

OTHER PUBLICATIONS

Mbairi F D et al., "High-Frequency Transmission Lines Crosstalk Reduction Using Spacing Rules", IEEE Transactions on Components and Packaging Technologies, vol. 31, No. 3, Sep. 1, 2008, pp. 601-610.

Weiler Alexander et al., "High Speed Layout Guidelines", Jan. 1, 2006, pp. 1-21.

International Search Report and Written Opinion dated Nov. 25, 2020 in corresponding International Application No. PCT/KR2020/010126.

* cited by examiner

ELECTRONIC DEVICE HAVING FPCB

CROSS-REFERENCE TO RELATED APPLICATION

This application is based on and claims priority under 35 U.S.C. § 119 to Korean Patent Application No. 10-2019-0094597, filed on Aug. 2, 2019, in the Korean Intellectual Property Office, the disclosure of which is incorporated by reference herein in its entirety.

BACKGROUND

1) Field

The disclosure relates to an electronic device having a flexible printed circuit board (FPCB).

2) Description of Related Art

Electronic devices include antenna modules that support wireless communication services in various frequency bands, for instance 3G, 4G, or 5G services. To support a 3G/4G communication system such as GSM or LTE in the electronic devices, a part of a metal housing of the electronic device or a conductive pattern inside the electronic device is generally used as an antenna. Further, to support a 5G communication system using a relatively high frequency band in the electronic devices, a patch antenna module in which a plurality of antenna patches are disposed in an array pattern may be used as an antenna.

Meanwhile, a processor (e.g., a communication processor (CP)) of the electronic device performs communication with a base transceiver station, and decides a communication system to be used in the electronic device. For example, the electronic device performs communication with the base transceiver station using one or more of the 3G/4G communication system or the 5G communication system. A processor or a PCB on which a processor is mounted can be electrically connected to each antenna module through a connector in order to control each antenna module.

The electronic device has a limited mounting space, and as the communication system that should be supported in the electronic device is diversified, it is not easy to individually mount connectors for connecting antenna modules based on the communication systems to a processor. Furthermore, in the case where antenna modules using different communication systems or different frequency bands are connected to a processor through one connector, isolation performance of the antenna can be deteriorated. For example, signals transmitted/received to/from one antenna module through a connector may have an influence on signals transmitted/received to/from the other antenna modules.

Especially, because 5G is a communication system using a very high frequency band, power consumption is overwhelming compared to 3G/4G. Therefore, power transmission lines for 5G communication may be additionally provided to a connector connected to a patch antenna module for supporting 5G. For this reason, in the case where a connector for connecting a 3G/4G antenna module and a 5G antenna module to a processor is used, an influence caused by power transmission in addition to communication signals should be taken into consideration.

The above information is presented as background information only to assist with an understanding of the disclosure. No determination has been made, and no assertion is made, as to whether any of the above might be applicable as prior art with regard to the disclosure.

SUMMARY

Embodiments of the disclosure provide an electronic device for securing a mounting space inside the electronic device and improving transmitting/receiving performance of antenna modules, and an FPCB included in the electronic device.

Embodiments of the disclosure provide an electronic device that can connect antenna modules operated at different frequency bands to a single connector, and save a mounting space of the electronic device.

Embodiments of the disclosure provide an electronic device that can reduce noises generated by power transmission lines of a connector that connects antenna modules.

In accordance with an example embodiment of the disclosure, an electronic device includes: a housing including at least a part of a lateral surface of the electronic device; a printed circuit board (PCB) disposed in the housing; at least one wireless communication circuit disposed on the PCB; a first antenna module comprising at least one antenna disposed in a first region inside the housing; a second antenna module comprising at least one antenna disposed in a second region inside the housing; a third antenna module comprising at least one antenna disposed in a third region inside the housing; a first flexible printed circuit board (FPCB) connecting the first antenna module to the at least one wireless communication circuit; and a second FPCB connecting the second antenna module and the third antenna module to the at least one wireless communication circuit. The second FPCB includes: a first connector disposed on the PCB and coupled to a first joint electrically connected to the wireless communication circuit; a second connector coupled with a second joint electrically connected to the second antenna module; a third connector coupled with a third joint electrically connected to the third antenna module; and a coupler connecting the first connector, the second connector, and the third connector.

In accordance with an example embodiment of the disclosure, a flexible printed circuit board (FPCB) disposed in an electronic device includes: a first connector including a plurality of first terminals and a plurality of second terminals coupled with a first joint disposed in an electronic device; a second connector coupled to a second joint disposed in the electronic device; a third connector coupled to a third joint disposed in the electronic device; and a coupler connecting the first connector, the second connector, and the third connector. The plurality of first terminals are connected to the second connector through the coupler, and the plurality of second terminals are connected to the third connector through the coupler.

The electronic device according to various example embodiments of the disclosure can connect antenna modules operated at different frequency bands to a single connector, and save a mounting space of the electronic device.

The electronic device according to various example embodiments of the disclosure can reduce noises generated by power transmission lines of a connector that connects antenna modules.

The effects obtainable in the disclosure are not limited to the above-mentioned effects, and other effects, which are not mentioned above, will be understood by those skilled in the art from the following detailed description.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
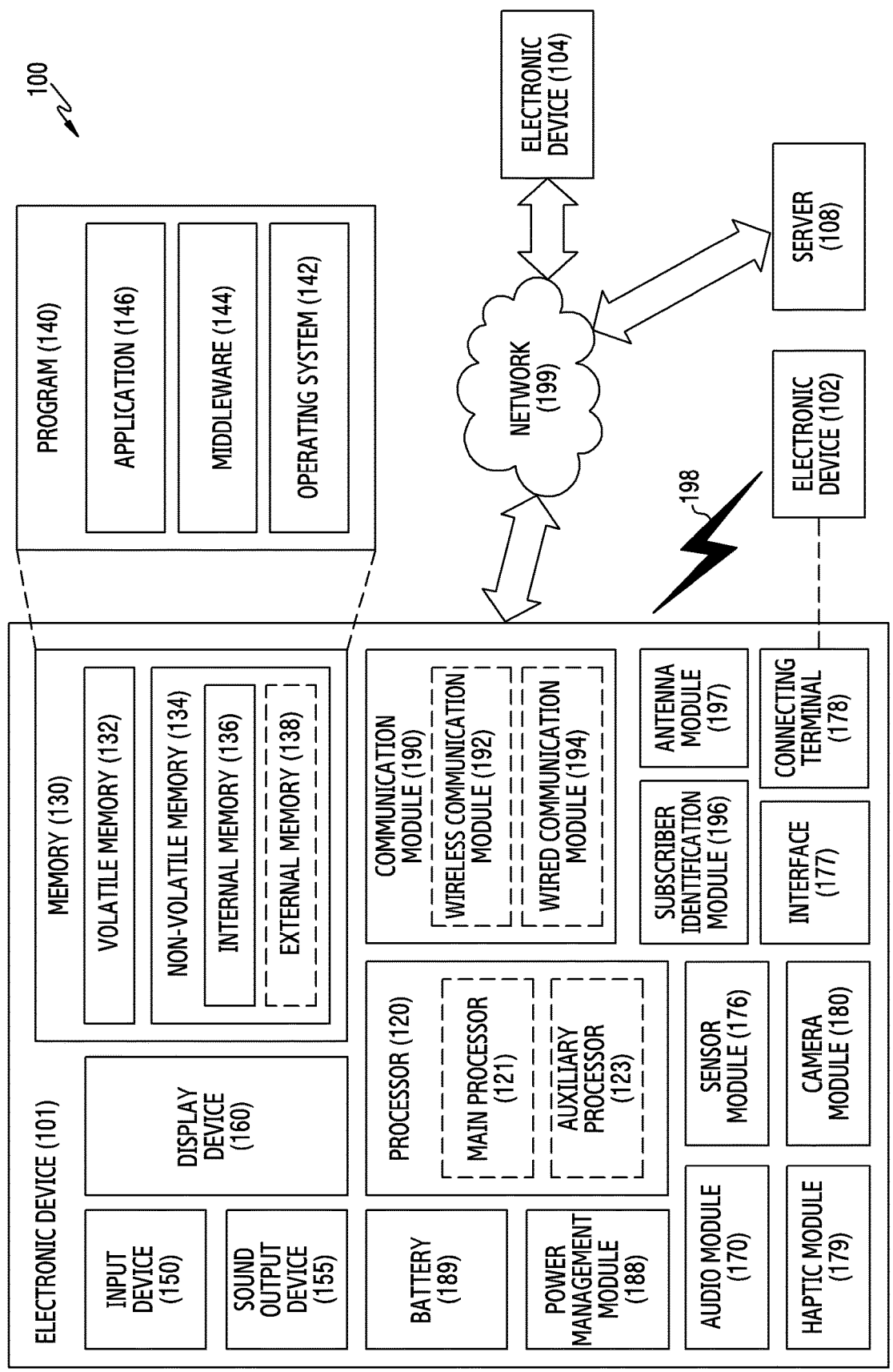
FIG. 1 is a block diagram illustrating an example electronic device in a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an example embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an example embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™ wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
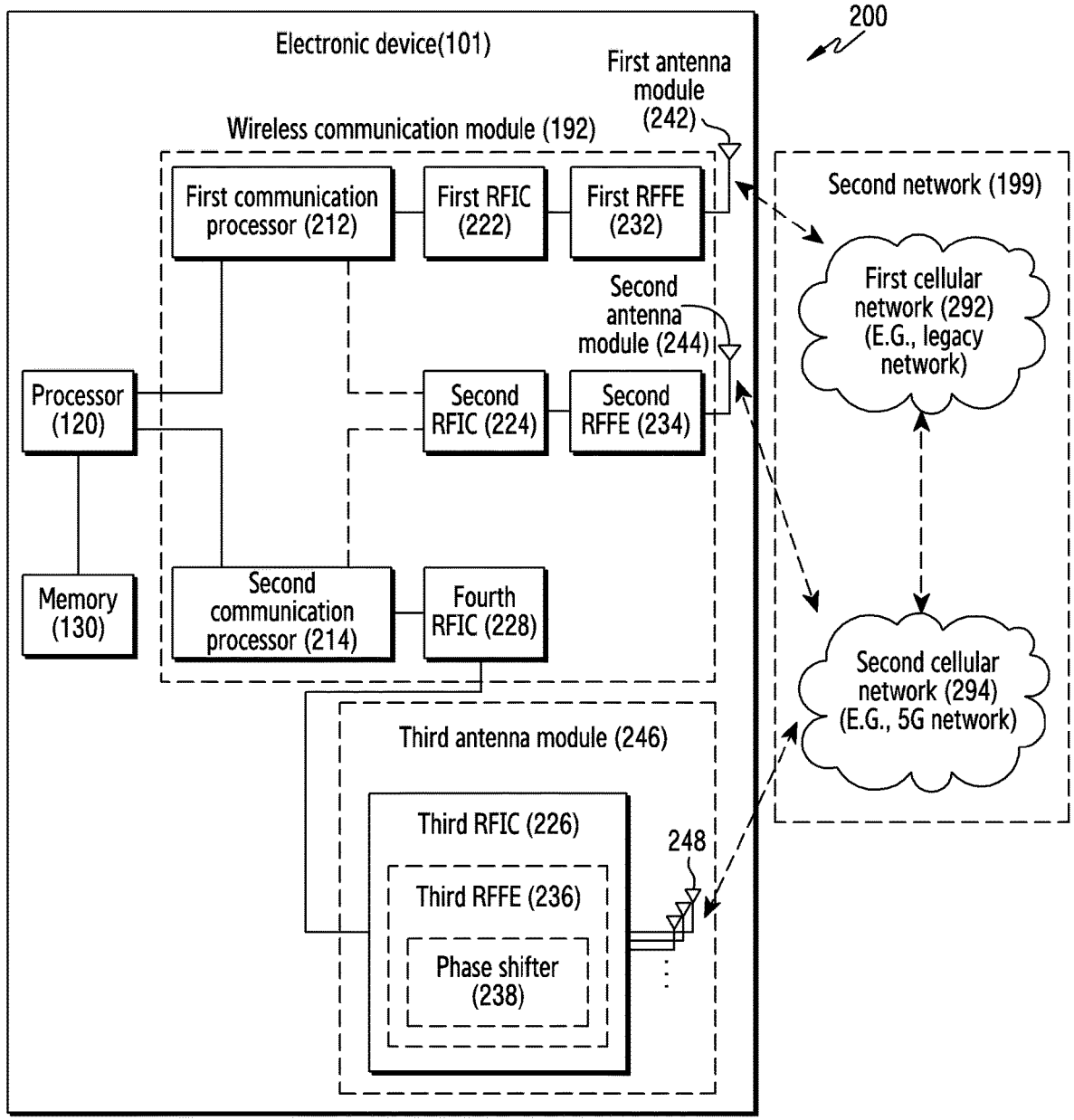
FIG. 2 is a block diagram illustrating an example electronic device for supporting legacy network communication and 5G network communication according to various embodiments.

FIG. 2 is a block diagram 200 illustrating an example electronic device 101 supporting legacy network communication and 5G network communication according to various embodiments. Referring to FIG. 2, an electronic device 101 may include a first communication processor (e.g., including communication processing circuitry) 212, a second communication processor (e.g., including communication processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor (e.g., including processing circuitry) 120 and a memory 130. A network 199 may include a first network 292 and a second network 294. According to another embodiment, the electronic device 101 may further include at least one of the components illustrated in FIG. 1, and the network 199 may further include at least one different network. According to an embodiment, the first communication processor 212, the second communication processor 214, the first RFIC 222, the second RFIC 224, the fourth RFIC 228, the first RFFE 232, and the second RFFE 234 may form at least a part of a wireless communication module 192. According to another embodiment, the fourth RFIC 228 may be omitted, or be included as a part of the third RFIC 226.

The first communication processor 212 may establish communication channels of a band to be used for wireless communication with the first network 292, and support legacy network communication through the established communication channels. According to various embodiments, the first network may be a legacy network that includes a second generation (2G), 3G, 4G, or long term evolution (LTE) network. The second communication processor 214 may establish communication channels corresponding to a designated band (e.g., about 6 GHz to about 60 GHz) among bands to be used for wireless communication with the second network 294, and support 5G network communication through the established communication channels. According to various embodiments, the second network 294 may be a 5G network defined in 3GPP. In addition, according to an embodiment, the first communication processor 212 or the second communication processor 214 may establish communication channels corresponding to another designated band (e.g., about 6 GHz or less) among the bands to be used for the wireless communication with the second network 294, and support the 5G network communication through the established communication channels. According to an embodiment, the first communication processor 212 and the second communication processor 214 may be implemented within a single chip or a single package. According to various embodiments, the first communication processor 212 or the second communication processor 214 may be formed within a single chip or a single package along with the processor 120, an auxiliary processor 123, or a communication module 190.

The first RFIC 222 may convert a baseband signal generated by the first communication processor 212 at the time of transmission into a radio frequency (RF) signal of about 700 MHz to about 3 GHz used in the first network 292 (e.g., the legacy network). At the time of reception, the RF signal may be obtained from the first network 292 (e.g., the legacy network) through the antenna (e.g., the first antenna module 242), and be preprocessed through the RFFE (e.g., the first RFFE 232). The first RFIC 222 may convert the preprocessed RF signal into a baseband signal so as to be able to be processed by the first communication processor 212.

The second RFIC 224 may convert a baseband signal generated by the first communication processor 212 or the second communication processor 214 at the time of transmission into an RF signal (hereinafter referred to as 5G Sub6 RF signal) of a Sub6 band (e.g., about 6 GHz or less) used in the second network 294 (e.g., the 5G network). At the time of reception, the 5G Sub6 RF signal may be obtained from the second network 294 (e.g., the 5G network) through the antenna (e.g., the second antenna module 244), and be preprocessed through the RFFE (e.g., the second RFFE 234). The second RFIC 224 may convert the preprocessed 5G Sub6 RF signal into a baseband signal so as to be able to be processed by one corresponding to the first communication processor 212 or the second communication processor 214.

The third RFIC 226 may convert a baseband signal generated by the second communication processor 214 at the time of transmission into an RF signal (hereinafter referred to as 5G Above6 RF signal) of a 5G Above6 band (e.g., about 6 GHz to about 60 GHz) to be used in the second network 294 (e.g., the 5G network). At the time of reception, the 5G Above6 RF signal may be obtained from the second network 294 (e.g., the 5G network) through the antenna (e.g., the antenna 248), and be preprocessed through the third RFFE 236. The third RFIC 226 may convert the preprocessed 5G Above6 RF signal into a baseband signal so as to be able to be processed by the second communication processor 214. According to an embodiment, the third RFFE 236 may be formed as a part of the third RFIC 226.

According to an embodiment, the electronic device 101 may include the fourth RFIC 228 separately from the third RFIC 226 or as a part of the third RFIC 226. In this case, the fourth RFIC 228 may convert a baseband signal generated by the second communication processor 214 into an RF signal (hereinafter referred to as IF signal) of an intermediate frequency band (e.g., about 9 GHz to about 11 GHz), and then transmit the IF signal to the third RFIC 226. The third RFIC 226 may convert the IF signal into the 5G Above6 RF signal. At the time of reception, the 5G Above6 RF signal may be received from the second network 294 (e.g., the 5G network) through the antenna (e.g., the antenna 248), and be converted into the IF signal by the third RFIC 226. The fourth RFIC 228 may convert the IF signal into a baseband signal so as to be able to be processed by the second communication processor 214.

According to an embodiment, the first RFIC 222 and the second RFIC 224 may be implemented as a single chip or at least a part of a single package. According to an embodiment, the first RFFE 232 and the second RFFE 234 may be implemented as a single chip or at least a part of a single package. According to an embodiment, at least one of the first antenna module 242 or the second antenna module 244 may be omitted, or be coupled with a different antenna module, and process RF signals of a plurality of corresponding bands.

According to an embodiment, the third RFIC 226 and the antenna 248 may be disposed on the same substrate, and form the third antenna module 246. For example, the wireless communication module 192 or the processor 120 may be disposed on a first substrate (e.g., a main PCB). In this case, the third RFIC 226 may be disposed in a partial region (e.g., a lower surface) of a second substrate (e.g., sub-PCB) separately from the first substrate, and the antenna 248 may be disposed in another partial region (e.g., an upper surface), and the third antenna module 246 may be formed. The third RFIC 226 and the antenna 248 are disposed on the same substrate, and thereby a length of a transmission line between the third RFIC 226 and the antenna 248 can be reduced. This enables, for instance, a signal of a high frequency band (e.g., about 6 GHz to about 60 GHz) used for 5G network communication to reduce a loss (e.g., attenuation) caused by a transmission line. For this reason, the electronic device 101 can improve a quality or a speed of communication with the second network 294 (e.g., the 5G network).

According to an embodiment, the antenna 248 may be formed of an antenna array including a plurality of antenna elements that can be used for beamforming. In this case, the third RFIC 226 may include, for instance, a plurality of phase shifters 238 corresponding to the plurality of antenna elements as a part of the third RFFE 236. At the time of transmission, each of the plurality of phase shifters 238 may convert a phase of the 5G Above6 RF signal to be transmitted to an outside (e.g., a base station of the 5G network) of the electronic device 101 through the corresponding antenna element. At the time of reception, each of the plurality of phase shifters 238 may convert the phase of the 5G Above6 RF signal received from the outside into the same phase or substantially the same phase through the corresponding antenna element. This enables transmission or reception through beamforming between the electronic device 101 and the outside.

The second network 294 (e.g., the 5G network) may be operated independently of the first network 292 (e.g., Stand-Alone (SA)), or be connected and operated to the first network 292 (e.g., the legacy network) (e.g., Non-Stand Alone (NSA)). For example, the 5G network may have only an access network (e.g., a 5G radio access network (RAN) or a next generation RAN (NG RAN)), and may not have a core network (e.g., a next generation core (NGC)). In this case, the electronic device 101 may access the access network of the 5G network, and then access an external network (e.g., Internet) under control of a core network (e.g., an evolved packed core (EPC)) of the legacy network. Protocol information (e.g., LTE protocol information) for communication with the legacy network or protocol information (e.g., new radio (NR) protocol information) for communication with the 5G network may be stored in the memory 230, and be accessed by another component (e.g., the processor 120), the first communication processor 212, or the second communication processor 214.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 3:
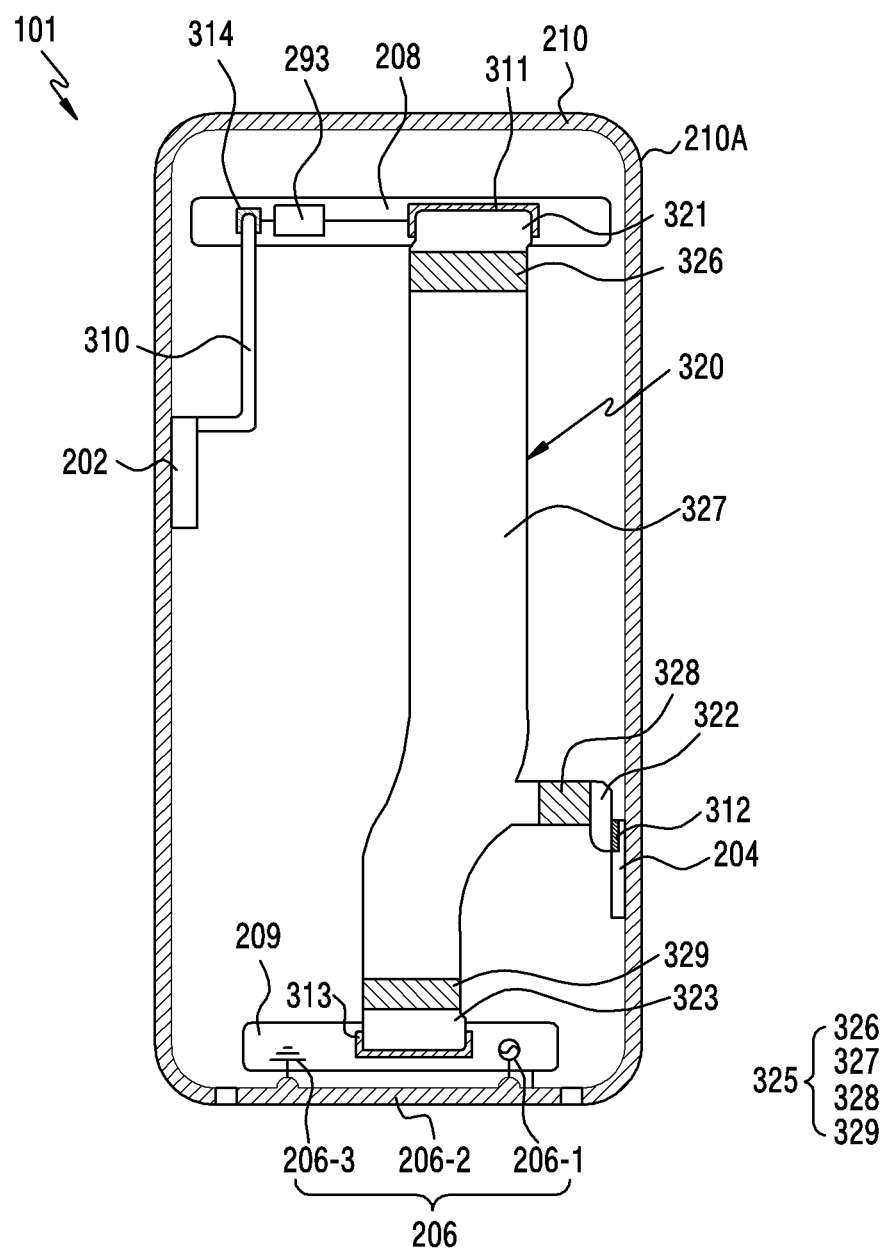
FIG. 3 is a diagram illustrating an example electronic device according to various embodiments.

FIG. 3 is a diagram illustrating an example electronic device according to various embodiments.

For convenience of description, a display unit 160 (e.g., a display) that is not illustrated in FIG. 3 is omitted. The display unit 160 can be seen by a user through a front surface of the electronic device 101. The electronic device 101 of FIG. 3 may include at least some of the components of FIGS. 1 and 2.

Referring to FIG. 3, the electronic device 101 may include a housing 210, a first printed circuit board (PCB) 208, a first antenna module 202, a second antenna module 204, a first flexible printed circuit board (FPCB) 310, a third antenna module 206, and a second FPCB 320.

According to an embodiment, the housing 210 may form at least a part of a lateral surface 210A and a rear surface (not illustrated) of the electronic device 101. The rear surface may be formed by a substantially opaque rear plate. The lateral surface 210A may be joined with the rear plate, and be formed by a lateral bezel structure (or a lateral member) that includes a metal and/or a polymer. In an embodiment, the lateral surface 210A and the rear surface may be integrally formed. According to an embodiment, various components may be mounted in a space defined by the lateral surface 210A and the rear surface of the housing 210.

According to an embodiment, the first PCB 208 may be disposed in a space defined by the housing 210. In an embodiment, the first PCB 208 may include a first joint 311 and a fourth joint 314 that are coupled with connectors of the FPCBs for connecting the antenna modules. In an embodiment, at least some of the components of FIG. 1, for instance the processor 120 and/or the memory 130, may be disposed on the first PCB 208.

According to an embodiment, a wireless communication circuit 293 (e.g., the wireless communication module 192 of FIG. 1) may be disposed on the first PCB 208, and be electrically connected to the first PCB 208. According to an embodiment, the wireless communication circuit 293 may be electrically connected to the first joint 311 and the fourth joint 314 that are disposed on the first PCB 208. In an embodiment, the first joint 311 and the fourth joint 314 may be coupled with the connectors of the FPCBs for connecting the antenna modules that support various frequency bands. The wireless communication circuit 293 may be electrically connected to the antenna modules through the joints and the connectors of the FPCBs. As an example, the wireless communication circuit 293 may be electrically connected to the first antenna module 202 through the fourth joint 314 and the first FPCB 310. As another example, the wireless communication circuit 293 may be electrically connected to the second antenna module 204 and the third antenna module 206 through the first joint 311 and the second FPCB 320.

In an embodiment, the wireless communication circuit 293 may be configured to transmit power and/or signals to the antenna modules. In an embodiment, the wireless communication circuit 293 may be configured to transmit and/or receive radio frequency (RF) signals through the antenna modules.

According to various embodiments, the joint may, for example, and without limitation, be formed of a socket, a plug, or the like, and the connector may also be formed, for example, and without limitation, of a plug, a socket, or the like. The socket of the joint may be coupled with the plug of the connector, or the plug of the joint may be coupled with the socket of the connector. In various embodiments to be described below, the socket and the plug are described without discrimination, which is for convenience of description. The joint and the connector to be described below are not limited to any one of the socket or the plug.

In an embodiment, the first antenna module 202 may include an antenna array or an FPCB and a radio frequency integrate circuit (RFIC) on which the antenna array is disposed. In another embodiment, at least one of the aforementioned components may be omitted, or at least two of the components may be integrally formed.

In an embodiment, the antenna array may be formed in an inside and/or a surface of the first antenna module 202. In an embodiment, the antenna array may include various types of antenna arrays. For example, the antenna array may include a patch antenna array or a dipole antenna array.

According to an embodiment, the RFIC (or an intermediate frequency integrate circuit (IFIC)) may be configured to process an RF signal that is transmitted or received through the antenna array. For example, at the time of transmission, the RFIC may convert an intermediate frequency (IF) signal or a baseband signal obtained from the wireless communication circuit 293 into an RF signal of a designated band. For example, the RFIC may convert an RF signal obtained from the antenna array into an IF signal or a baseband signal at the time of reception, and provide the converted IF signal or baseband signal to the wireless communication circuit 293.

In an embodiment, the first antenna module 202 may be supplied with power through the first FPCB 310, and provide the necessary power to various components of the first antenna module 202, for instance the RFIC.

In an embodiment, the first antenna module 202 may be a mmWave antenna module for 5G network communication. In an embodiment, the wireless communication circuit 293 may be configured to transmit and/or receive a wireless signal having a frequency in a range of, for example, 6 GHz to 100 GHz through the first antenna module 202.

In an embodiment, when the second antenna module 204 is compared with the aforementioned first antenna module 202, a position thereof disposed in the electronic device 101 may be different, and the remaining configuration may be the same or at least similar, and thus duplicate description will not be repeated here.

In an embodiment, the first antenna module 202 and the second antenna module 204 may be disposed in a space defined by the housing 210. In an embodiment, the first antenna module 202 and the second antenna module 204 may be disposed adjacent to the lateral surface 210A of the housing 210. However, in various embodiments, the patch antenna module may be disposed spaced apart from the lateral surface, and be disposed adjacent to the rear surface or the front surface or toward the rear surface or the front surface. For example, the first antenna module 202 may be disposed on the rear surface of the housing 210, and the second antenna module 204 may be disposed on the lateral surface of the housing 210.

In an embodiment, among edges of the lateral surface 210A, the edge to which the first antenna module 202 is adjacent may be different from the edge to which the second antenna module 204 is adjacent. For example, the first antenna module 202 may be disposed adjacent to the left edge among the edges of the lateral surface 210A, and the second antenna module 204 may be disposed adjacent to the right edge among the edges of the lateral surface 210A. In an embodiment, a position of the first antenna module 202 disposed in the housing 210 and a position of the second antenna module 204 disposed in the housing 210 may not correspond to each other. For example, in comparison with the first antenna module 202, the second antenna module 204 may be disposed relatively at a lower end of the electronic device 101 in the housing 210.

In an embodiment, the first antenna module 202 and the second antenna module 204 may be disposed such that a flat portion of the antenna array looks at the lateral surface 210A. In the case where the first antenna module 202 or the second antenna module 204 is disposed on the rear surface of the housing 210, the flat portion of the antenna array may be disposed to look at the rear surface.

In an embodiment, one end of the first FPCB 310 is coupled to the fourth joint 314 of the first PCB 208, and the other end of the first FPCB 310 may be coupled to the first antenna module 202. The first antenna module 202 and the first PCB 208 may be electrically connected by the first FPCB 310. In an embodiment, the first FPCB 310 may extend from the fourth joint 314 to the first antenna module 202 with at least a part thereof being bent.

According to an embodiment, the third antenna module 206 may include a power supplier 206-1, a ground 206-3, and a conductive member (e.g., including a conductive material) 206-2.

In an embodiment, the power supplier 206-1 may be formed in one region of the second PCB 209. The power supplier 206-1 may be in contact with one point of the conductive member 206-2, and be electrically connected to the conductive member 206-2.

In an embodiment, the ground 206-3 may be separated from the power supplier 206-1, and be formed in one region of the second PCB 209. The ground 206-3 may be in contact with a point different from the one point of the conductive member 206-2, and be electrically connected to the conductive member 206-2.

In an embodiment, the conductive member 206-2 may form at least a part of the lateral surface 210A of the housing 210. Non-conductive members may be formed at opposite ends of the conductive member 206-2, and the conductive member 206-2 may maintain a state that is electrically insulated from the remaining part of the lateral surface 210A. In an embodiment, the conductive member 206-2 may be supplied with power by the power supplier 206-1, and be operated as an antenna radiator of the third antenna module 206.

According to an embodiment, the conductive member 206-2 of the third antenna module 206 may be omitted. In this case, the component of the electronic device 101 other than the conductive member 206-2 may be operated as the antenna radiator of the third antenna module 206. The third antenna module 206 may be formed of a patch antenna module including an antenna array. In this case, the wireless communication circuit 293 may be configured to transmit or receive a wireless signal having a frequency in a range of, for example, 6 GHz to 100 GHz through the third antenna module 206.

According to an embodiment, the second FPCB 320 may include a first connector 321, a second connector 322, a third connector 323, and a coupler 325. In an embodiment, the second FPCB 320 may electrically connect the second antenna module 204 to the wireless communication circuit 293. The power and the signal transmitted by the wireless communication circuit 293 may be provided to the second antenna module 204 through the second FPCB 320. The signal obtained through the second antenna module 204 may be provided to the wireless communication circuit 293 through the second FPCB 320.

In an embodiment, the second FPCB 320 may electrically connect the third antenna module 206 to the wireless communication circuit 293. The signal transmitted from the wireless communication circuit 293 may be provided to the third antenna module 206 through the second FPCB 320. The signal obtained through the third antenna module 206 may be provided to the wireless communication circuit 293 through the second FPCB 320. In an embodiment, the wireless communication circuit 293 may transmit and/or receive an RF signal of a band in a range of, for example, 700 MHz to 6 GHz through the third antenna module 206.

In an embodiment, the first connector 321 may be coupled to the first joint 311 formed on the first PCB 208. The first connector 321 may be electrically connected to the wireless communication circuit 293 through the first joint 311. In an embodiment, the first connector 321 may include a plurality of terminals connected to the first joint 311 in order to transmit the signal or the power.

In an embodiment, the second connector 322 may be coupled to a second joint 312 formed on the second antenna module 204, and be electrically connected to the second antenna module 204. In an embodiment, the second connector 322 may include a plurality of terminals connected to the second joint 312 in order to transmit the signal or the power.

In an embodiment, the third connector 323 may be coupled to a third joint 313 formed on the second PCB 209, and be electrically connected to the second PCB 209. In an embodiment, the third connector 323 may include a plurality of terminals connected to the third joint 313 in order to transmit the signal.

In an embodiment, the coupler 325 may include a plurality of layers. The plurality of layers may include at least one transmitting layer to which the signal/power is transmitted, and non-conductive layers that are layered alternately with the at least one transmitting layer. In an embodiment, the coupler 325 may include a plurality of transmission lines. In an embodiment, the plurality of transmission lines may be formed of wiring that is formed on the transmitting layer, and a conductive via that is formed in the non-conductive layer and is connected to the wiring. The plurality of transmission lines may be spaced apart from each other in the transmitting layer.

In an embodiment, the coupler 325 may include a first flexible section 326, a first rigid section 327, a second flexible section 328, and a third flexible section 329. In an embodiment, the first flexible section 326 may be connected to the first connector 321, and extend to the first rigid section 327. In an embodiment, the first rigid section 327 may extend from the first flexible section 326 to the second flexible section 328 and the third flexible section 329.

In an embodiment, the number of layers layered on the first rigid section 327 may be different from that layered on the first flexible section 326, the second flexible section 328, and/or the third flexible section 329.

In an embodiment, the first flexible section 326, the second flexible section 328, and the third flexible section 329 may include a layer formed of a soft material (e.g., polyimide). In an embodiment, the first flexible section 326, the second flexible section 328, and the third flexible section 329 may be bent. As the first flexible section 326, the second flexible section 328, and/or the third flexible section 329 is bent, at least one of the first connector 321, the second connector 322, the third connector 323, or the first rigid section 327 may be disposed in the electronic device 101 at different heights.

In an embodiment, the coupler 325 may be connected to the first connector 321, the second connector 322, and the third connector 323. In an embodiment, the coupler 325 may extend from the first connector 321 to the second connector 322 and the third connector 323.

In an embodiment, some of the plurality of transmission lines included in the coupler 325 may configured such that the first connector 321 is connected to one ends thereof, and the second connector 322 is connected to the other ends thereof. The rest of the plurality of transmission lines may configured such that the first connector 321 is connected to one ends thereof, and the third connector 323 is connected to the other ends thereof.

In an embodiment, the plurality of transmission lines included in the coupler 325 may configured such that the plurality of terminals included in the first connector 321 are connected to one ends thereof, and the terminals included in the second connector 322 and the terminals included in the third connector 323 are connected to the other ends thereof.

In an embodiment, the plurality of transmission lines of the coupler 325 may include a signal line and power transmission lines. In an embodiment, the wireless communication circuit 293 may provide the signal and the power to the second antenna module 204 through the signal line and the power transmission lines of the second FPCB 320. In an embodiment, the wireless communication circuit 293 may transmit the signal to the third antenna module 206 through the signal line of the second FPCB 320.

In an embodiment, both the second antenna module 204 and the third antenna module 206 are connected through the second FPCB 320, and thereby a component mounting space inside the electronic device 101 can be saved.

Figure 4:
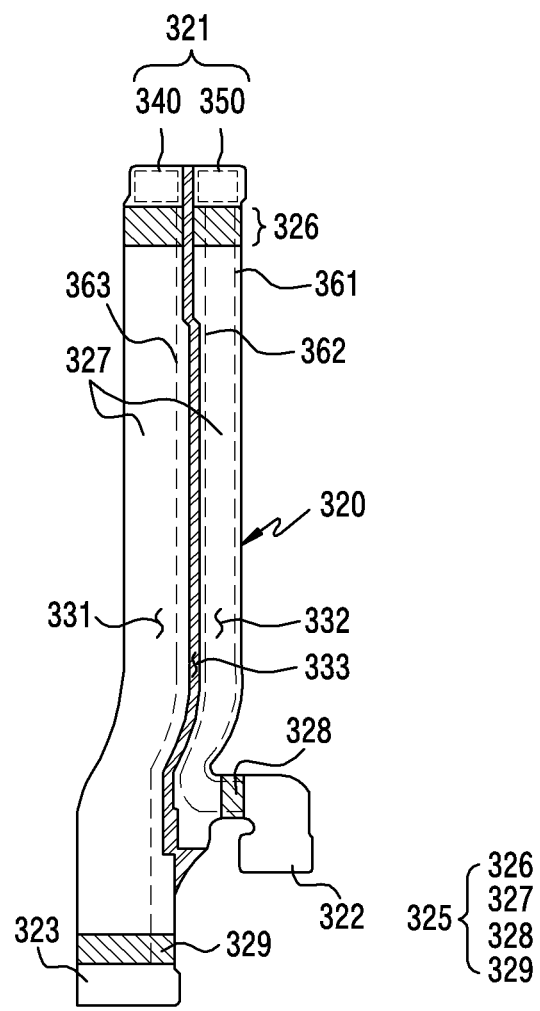
FIG. 4 is a diagram illustrating an example FPCB according to various embodiments.

FIG. 4 is a diagram illustrating an example FPCB according to various embodiments.

In description of the second FPCB 320 of FIG. 4, contents overlapping the description of the second FPCB 320 of FIG. 3 may not be repeated here.

In an embodiment, the second FPCB 320 may include a first region 331, a second region 332, and a third region 333.

In an embodiment, the first region 331 may include a part of the first connector 321, a part of the coupler 325, and the third connector 323. In an embodiment, the second region 332 may include a part of the first connector 321, a part of the coupler 325, and the second connector 322. In an embodiment, the third region 333 may be formed of the remaining region excluding the first region 331 and the second region 332 of the second FPCB 320. In an embodiment, the third region 333 may include, for example, a dielectric or a non-conductive material.

In an embodiment, the first region 331 and the second region 332 may be spaced by a designated distance or more. For example, the first region 331 and the second region 332 may be spaced by about 0.15 mm or more, for example, 0.175 mm. In this case, a width of the third region 333 may, for example, be 0.175 mm.

In an embodiment, the first connector 321 may include a first terminal group 340 and a second terminal group 350.

In an embodiment, the first terminal group 340 may include a plurality of first terminals. The plurality of first terminals may be connected to the third connector 323 through the transmission lines of the coupler 325.

In an embodiment, the second terminal group 350 may include a plurality of second terminals. The plurality of second terminals may be connected to the second connector 322 through the transmission lines of the coupler 325.

In an embodiment, the first connector 321 may be formed such that a region in which the first terminal group 340 is disposed and a region in which the second terminal group 350 is disposed are spaced from each other. In an embodiment, the first terminal group 340 and the second terminal group 350 of the first connector 321 may be spaced apart by the third region 333.

In an embodiment, the third region 333 of the coupler 325 may include a first signal line 361 and first power transmission lines 362.

In an embodiment, the first signal line 361 may be configured such that a first terminal of the second terminal group 350 is connected to one end thereof, and any one of the plurality of terminals included in the second connector 322 is connected to the other end thereof. In an embodiment, the signal may be transmitted to the second antenna module 204 through the first signal line 361.

In an embodiment, the first power transmission lines 362 may be configured such that a second terminal of the second terminal group 350 is connected to one end thereof, and any one of the plurality of terminals included in the second connector 322 is connected to the other end thereof. In an embodiment, the power may be provided to the second antenna module 204 through the first power transmission lines 362.

In an embodiment, the first signal line 361 and the first power transmission lines 362 may be spaced. In an embodiment, the first signal line 361 and the first power transmission lines 362 are spaced, and thereby induction of noises between the first power transmission lines 362 and the first signal line 361 can be lowered or prevented and/or reduced.

In an embodiment, the first signal line 361 may be disposed to be more distant from the third region 333 than the first power transmission lines 362. The first signal line 361 may be formed such that a length thereof is shorter than that of the first power transmission lines 362. In an embodiment, because the second antenna module 204 transmits/receives a wireless signal of a high frequency band (e.g., in a range of about 6 GHz to 100 GHz), an influence of a loss caused by the length of the transmission line may be greater than a signal of a frequency band used in 3G/4G. Therefore, to maintain the length of the transmission line so as to be short, the first signal line 361 may be selected to have a path that is shortest or relatively short within the second FPCB 320. In the embodiments of FIGS. 3 and 4, the first signal line 361 is located on a relatively right path within the second FPCB 320. In another embodiment, the first signal line 361 may be located on a different path, for instance a left path, within the second FPCB 320 depending on the position of the second antenna module 204. In this way, as the length of the first signal line 361 becomes shorter within the second region 332, a loss of the signal transmitted/received by the first signal line 361 can be reduced.

In an embodiment, the first region 331 of the coupler 325 may include a second signal line 363. In an embodiment, the second signal line 363 may be configured such that any one terminal of the first terminal group 340 is connected to one end thereof, and any one of the plurality of terminals included in the third connector 323 is connected to the other end thereof. In an embodiment, the second signal line 363 may be spaced apart from the third region 333. In an embodiment, the second signal line 363 may be spaced apart from the first power transmission lines 362 by the third region 333.

According to an embodiment, as illustrated in FIG. 4, the second FPCB 320 may include the third region 333 for securing a spaced distance between the first region 331 and the second region 332, or may be formed while including the first region 331 and the second region 332 without the third region 333.

Figure 5:
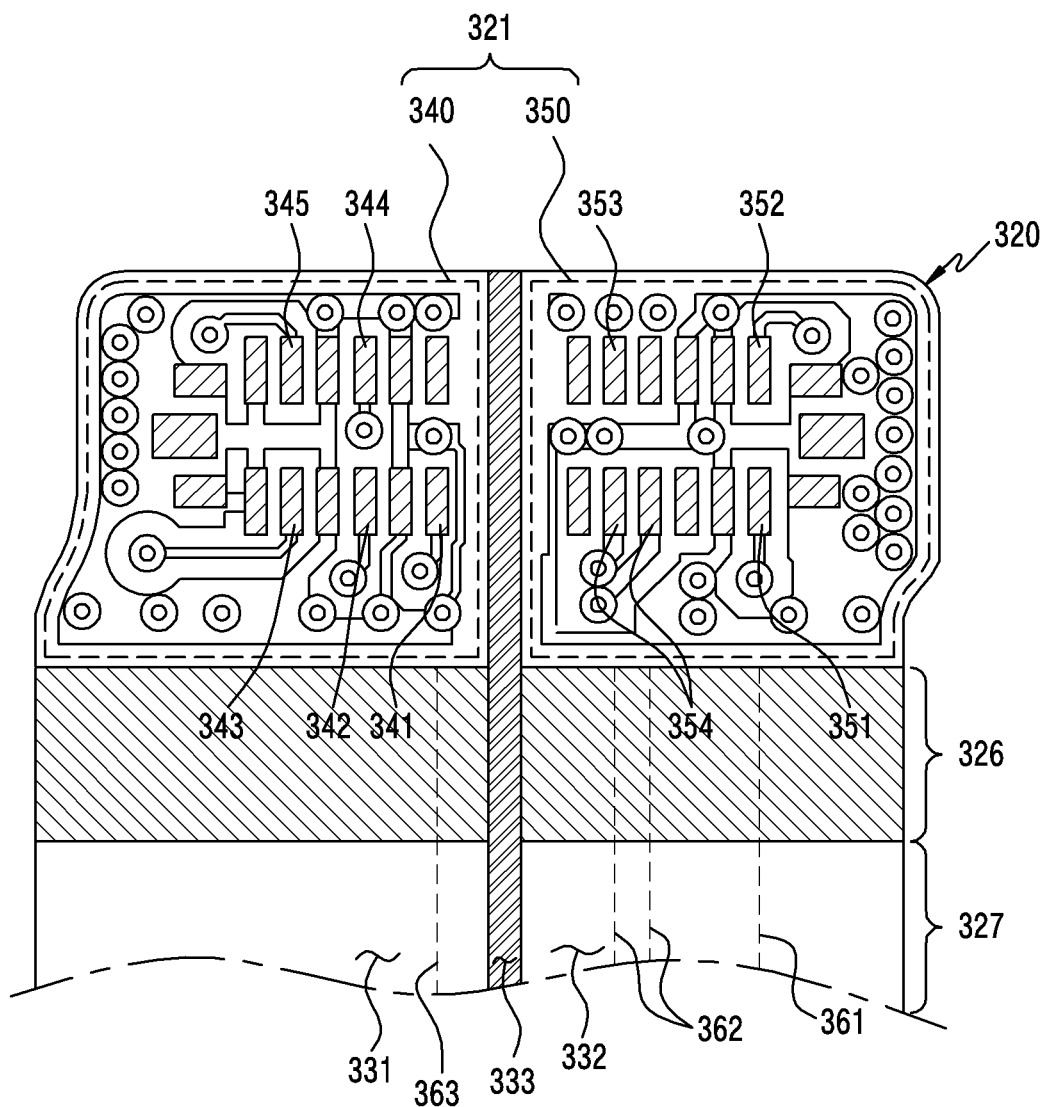
FIG. 5 is a diagram illustrating a first connector of a second FPCB according to various embodiments.

FIG. 5 is a diagram illustrating an example first connector of a second FPCB according to various embodiments.

Figure 6:
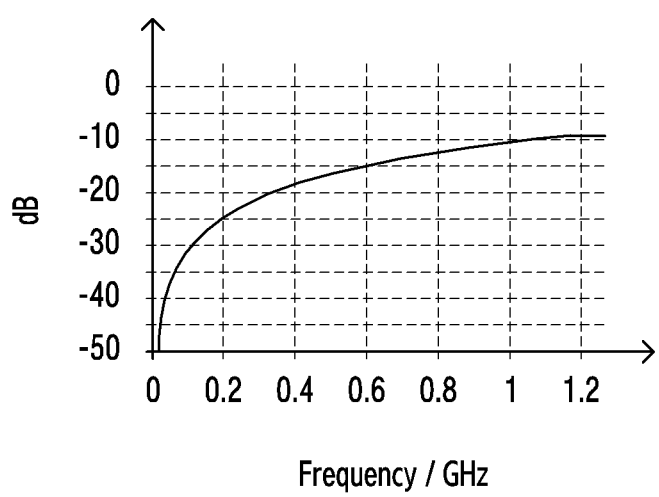
FIG. 6 is a graph illustrating a degree of isolation between antenna modules according to various embodiments.

FIG. 6 is a graph illustrating a degree of isolation between antenna modules according to various embodiments.

Figure 7:
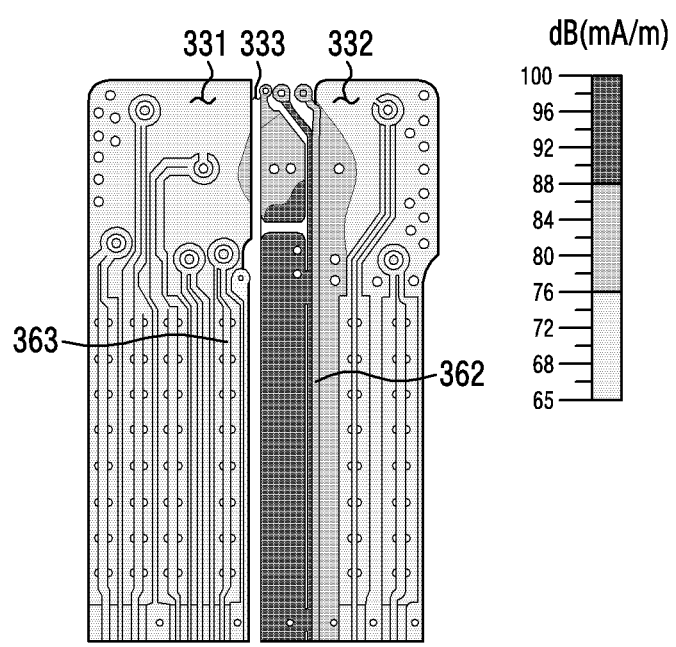
FIG. 7 is a diagram illustrating example noises caused by power transmission lines according to various embodiments.

FIG. 7 is a diagram illustrating example noises caused by power transmission lines according to various embodiments.

In an embodiment, the first terminal group 340 may include a first terminal 341, a second terminal 342, a third terminal 343, a fourth terminals 344, and a fifth terminal 345.

In an embodiment, the first terminal 341 may be operated as a terminal to which the signal transmitted or received by the third antenna module 206 is transmitted. In an embodiment, the first terminal 341 may be connected to the second signal line 363.

In an embodiment, the second terminal 342, the third terminal 343, the fourth terminals 344, and the fifth terminal 345 may be operated as terminals for signal transmission like the first terminal 341. To avoid duplicate description, only the second signal line 363 is illustrated on the first region 331, but the second terminal 342, the third terminal 343, the fourth terminals 344, and the fifth terminal 345 may be connected to the corresponding signal lines.

In an embodiment, the first terminal group 340 may further include another terminal in addition to the aforementioned first to fifth terminals 341 to 345. The other terminal may be connected to a ground terminal of the first joint 311, or be operated as a terminal for signal transmission.

In an embodiment, the second terminal group 350 may include a first terminal 351, a second terminal 352, a third terminal 353, and fourth terminals 354.

In an embodiment, the first terminal 351 and the second terminal 352 may be operated as terminals to which the wireless signal transmitted or received by the second antenna module 204 is transmitted. In an embodiment, the first terminal 351 may be connected to the first signal line 361, and the second terminal 352 may be connected to the corresponding transmission line (not illustrated) among the transmission lines of the second region 332.

In an embodiment, the third terminal 353 may be operated as a terminal for supplying power associated with an input/output interface of the second antenna module 204. The third terminal 353 may be connected to the transmission line (not illustrated) on the second region 332.

In an embodiment, the fourth terminals 354 may be operated as terminals for supplying the power of the second antenna module 204. For example, power may be supplied to the second antenna module 204 through the fourth terminals 354. The fourth terminals 354 may be connected to the first power transmission lines 362 of the second region 332. The number of first power transmission lines 362 may correspond to the number of fourth terminals 354, and may be two or more.

In an embodiment, the second terminal group 350 may further include another terminal in addition to the aforementioned first to fourth terminals 351 to 354. The other terminal may be connected to the ground terminal of the first joint 311, or be operated as a terminal for signal transmission or power transmission.

In an embodiment, the first terminal group 340 and the second terminal group 350 may be spaced apart by a designated distance or more. The third region 333 may be formed in a space where the first terminal group 340 and the second terminal group 350 are spaced. The third region 333 may include a dielectric or a non-conductive material. In an embodiment, the first terminal group 340 and the second terminal group 350 are spaced, and the third region 333 is formed in the spaced in-between space, and thereby signal interference between the third antenna module 206 connected to the first terminal group 340 and the second antenna module 204 connected to the second terminal group 350 may be prevented and/or reduced. Further, the plurality of transmission lines (e.g., the second signal line 363) connected to the first terminal group 340 and the plurality of transmission lines (e.g., the first signal line 361 and the first power transmission lines 362) connected to the second terminal group 350 are spaced, and the third region 333 is formed in the spaced space, and thereby the signal interference and noises between the third antenna module 206 and the second antenna module 204 can be reduced. For example, referring to FIG. 6, an isolation between the third antenna module 206 and the second antenna module 204 may be about −10 dB at 1 GHz. In an embodiment, the isolation between the third antenna module 206 and the second antenna module 204 may be less than or equal to −10 dB at a frequency band of 1 GHz or less. In an embodiment, in the case where an RF signal of the frequency band of 1 GHz or less is transmitted/received through the third antenna module 206, noises induced by the transmitted/received signal of the second signal line 363 or the third antenna module 206 by the transmission lines connected to the second terminal group 350 and the second terminal group 350 may be reduced by 10 dB or higher.

In an embodiment, the first power transmission lines 362 and the second signal line 363 may be spaced by a designated distance or more. The third region 333 may be formed in the spaced space. In an embodiment, the first power transmission lines 362 and the second signal line 363 are spaced, and the third region 333 is formed in the spaced space, and thereby noises caused by the first power transmission lines 362 can be prevented and/or reduced from being induced to the second signal line 363. For example, referring to FIG. 7, the noises caused by the first power transmission lines 362 may be obstructed by the third region 333, and may not be induced to the first region 331 or the second signal line 363.

An electronic device (e.g., an electronic device 101 of FIG. 3) according to an example embodiment includes: a housing (e.g., a housing 210 of FIG. 3) including at least a part of a lateral surface (e.g., a lateral surface 210A) of the electronic device; a printed circuit board (PCB) (e.g., a first PCB 208 of FIG. 3) disposed in the housing; at least one wireless communication circuit (e.g., a wireless communication circuit 293 of FIG. 3) disposed on the PCB; a first antenna module (e.g., a first antenna module 202 of FIG. 3) including at least one antenna and a second antenna module (e.g., a second antenna module 204 of FIG. 3) including at least one antenna disposed in a first region inside the housing; a third antenna module (e.g., a third antenna module 206 of FIG. 3) including at least one antenna disposed in a third region inside the housing; a first FPCB (e.g., a first FPCB 310 of FIG. 3) connecting the first antenna module to the at least one wireless communication circuit; and a second FPCB (e.g., a second FPCB 320 of FIG. 3) connecting the second antenna module and the third antenna module to the at least one wireless communication circuit. The second FPCB including a first connector (e.g., a first joint 311 of FIG. 3) disposed on the PCB and electrically connected to the wireless communication circuit, a second connector (e.g., a second connector 322 of FIG. 3) coupled with a joint (e.g., a second joint 312 of FIG. 3) connected electrically to the second antenna module, a third connector (e.g., a third connector 323 of FIG. 3) coupled with a joint (e.g., a third joint 313 of FIG. 3) connected electrically to the first antenna module, and a coupler (e.g., a coupler 325 of FIG. 3) connecting the first connector, the second connector, and the third connector.

In an example embodiment, in the electronic device, the first connector of the second FPCB may include a plurality of terminals, a first terminal (e.g., a first terminal 351 or a second terminal 352 of FIG. 5) of the plurality of terminals may be connected to the second connector through a first signal line (a signal path) (e.g., a first signal line 361 of FIG. 4) of the coupler, and a second terminal (e.g., a fourth terminals 354 of FIG. 5) of the plurality of terminals may be connected to the second connector through power transmission lines (power paths) (e.g., power transmission lines 362 of FIG. 4) of the coupler.

In an example embodiment, the second terminal may be closer to the center of the first connector than the first terminal.

In an example embodiment, a third terminal (e.g., a first terminal 341, a second terminal 342, a third terminal 343, a fourth terminals 344, or a fifth terminal 345 of FIG. 5) of the plurality of terminals may be connected to the third connector through a second signal line (e.g., a second signal line 363 of FIG. 5).

In an example embodiment, the second terminal and the third terminal may be spaced apart by a designated distance, and a region (e.g., a third region 333 of FIG. 4) between the spaced second terminal and third terminal may include a dielectric or a non-conductive material.

In an example embodiment, the first signal line may have a shorter length than a length of the power transmission lines.

In an example embodiment, the power transmission lines and the second signal line may be spaced by a designated distance or more.

In an example embodiment, a spaced region (e.g., a third region 333 of FIG. 4) between the power transmission lines and the second signal line may include a dielectric or a non-conductive material.

The power transmission lines may be closer to the spaced region formed between the power transmission lines and the second signal line than the first signal line.

In an example embodiment, the coupler may include a first flexible section (e.g., a first flexible section 326 of FIG. 3) extending from the first connector, a first rigid section (e.g., a first rigid section 327 of FIG. 3) extending from the first flexible section, a second flexible section (e.g., a second flexible section 328 of FIG. 3) extending from the first rigid section to the second connector, and a third flexible section (e.g., a third flexible section 329 of FIG. 3) extending from the first rigid section to the third connector.

In an example embodiment, the first antenna module and the second antenna module may include a patch antenna.

In an example embodiment, the at least one wireless communication circuit may be configured to receive a wireless signal having a frequency in a range of about 6 GHz to 100 GHz through the first antenna module and the second antenna module.

In an example embodiment, the first antenna module may include at least a part of a lateral surface of the electronic device, and the wireless communication circuit may be configured to supply power to at least a part of the lateral surface and to receive an RF signal.

In an example embodiment, a part of the lateral surface of the electronic device include a conductive region, the third antenna module may be electrically connected to the conductive region, and at least one wireless communication circuit may be configured to supply power to the conductive region and receive an RF signal.

An FPCB (e.g., a second FPCB 320 of FIG. 3) according to an example embodiment may include a first connector (e.g., a first connector 321 of FIG. 3) including a plurality of first terminals and a plurality of second terminals coupled with a first joint (e.g., a first joint 311 of FIG. 3) disposed in an electronic device (e.g., an electronic device 101 of FIG. 3), a second connector (e.g., a second connector 322 of FIG. 3) coupled to a second joint (e.g., a second joint 312 of FIG. 3) disposed in the electronic device, a third connector (e.g., a third connector 323 of FIG. 3) coupled to a third joint (e.g., a third joint 313 of FIG. 3) disposed in the electronic device, and a coupler (e.g., a coupler 325 of FIG. 3) connecting the first connector, the second connector, and the third connector, wherein the plurality of first terminals may be connected to the second connector through the coupler, and the plurality of second terminals may be connected to the third connector through the coupler.

In an example embodiment, a first terminal (e.g., a first terminal 351 of FIG. 5) of the plurality of first terminals may be connected to the second connector through a first signal line (e.g., a first signal line 361 of FIG. 4) of the coupler, and second terminals (e.g., fourth terminals 354 of FIG. 5) of the plurality of first terminals may be connected to the second connector through power transmission lines (e.g., first power transmission lines 362 of FIG. 4) of the coupler.

In an example embodiment, the first terminal and the second terminals may be spaced apart by a designated distance or more.

In an example embodiment, the second terminals may be closer to the center of the first connector than the first terminal.

In an example embodiment, a third terminal (e.g., a first terminal 341 of FIG. 5) of the plurality of second terminals may be connected to the third connector through the second signal line of the coupler.

In an example embodiment, the second signal line may be closer to the power transmission lines than the first signal line.

In an example embodiment, the power transmission lines and the second signal line may be spaced apart by a designated distance or more.

In an example embodiment, the spaced region (e.g., the third region 333 of FIG. 4) between the power transmission lines and the second signal line may include a dielectric or a non-conductive material.

In an example embodiment, the coupler may include a first flexible section (e.g., a first flexible section 326 of FIG. 3) extending from the first connector, a first rigid section (e.g., a first rigid section 327 of FIG. 3) extending from the first flexible section, a second flexible section (e.g., a second flexible section 328 of FIG. 3) extending from the first rigid section to the second connector, and a third flexible section (e.g., a third flexible section 329 of FIG. 3) extending from the first rigid section to the third connector.

In the above-described example embodiments of the disclosure, a component included in the disclosure is expressed in the singular or the plural according to a presented detailed embodiment. However, the singular form or plural form is selected for convenience of description suitable for the presented situation, and various embodiments of the disclosure are not limited to a single element or multiple elements thereof. Further, either multiple elements expressed in the description may be configured into a single element or a single element in the description may be configured into multiple elements.

While the disclosure has been illustrated and described with reference to various example embodiments thereof, it will be understood that the various example embodiments are intended to be illustrative, not limiting. It will be further understood by those skilled in the art that various changes in form and detail may be made without departing from the true spirit and full scope of the disclosure including the appended claims and equivalents thereof.

What is claimed is:

1. An electronic device comprising:
   a housing including at least a part of a lateral surface of the electronic device;
   a printed circuit board (PCB) disposed in the housing;
   at least one wireless communication circuit disposed on the PCB;
   a first antenna module including at least one antenna disposed in a first region inside the housing;
   a second antenna module including at least one antenna disposed in a second region inside the housing;
   a third antenna module including at least one antenna disposed in a third region inside the housing;
   a first flexible printed circuit board (FPCB) connecting the first antenna module to the at least one wireless communication circuit; and
   a second FPCB connecting the second antenna module and the third antenna module to the at least one wireless communication circuit,
   wherein the second FPCB includes:
   a first connector disposed on the PCB and electrically connected to the at least one wireless communication circuit;
   a second connector coupled with a second joint and electrically connected to the second antenna module for transmitting and receiving first signals;
   a third connector coupled with a third joint and electrically connected to the third antenna module for transmitting and receiving second signals;
   a coupler connecting the first connector, the second connector, and the third connector;
   a first signal line connecting a first terminal of the first connector and the second connector; and
   a second signal line connecting a second terminal of the first connector and the third connector.

2. The electronic device of claim 1, wherein:
   the first connector of the second FPCB includes a first terminal group that includes a plurality of terminals and a second terminal group that includes a plurality of terminals,
   wherein the first terminal of the second terminal group is connected to the second connector through the first signal line of the coupler,
   wherein the second terminal of the first terminal group is connected to the third connector through the second signal line of the coupler, and
   wherein a third terminal of the second terminal group is connected to the second connector through a power transmission line of the coupler.

3. The electronic device of claim 2, wherein the third terminal of the second terminal group is closer to a center of the first connector than the first terminal of the second terminal group.

4. The electronic device of claim 2, wherein:
   The third terminal of the second terminal group and the second terminal of the first terminal group are spaced apart by a designated distance or more; and
   wherein a region in the space between the third second terminal of the second terminal group and the second terminal of the first terminal group includes a dielectric or a non-conductive material.

5. The electronic device of claim 2, wherein the first signal line has a shorter length than a length of the power transmission line.

6. The electronic device of claim 2, wherein the power transmission line and the second signal line are spaced apart by a designated distance or more.

7. The electronic device of claim 6, wherein a spaced region between the power transmission lines and the second signal line includes a dielectric or a non-conductive material.

8. The electronic device of claim 6, wherein the power transmission line is closer to a spaced region between the power transmission line and the second signal line than the first signal line.

9. The electronic device of claim 1, wherein the coupler includes:
   a first flexible section extending from the first connector;
   a first rigid section extending from the first flexible section;
   a second flexible section extending from the first rigid section to the second connector; and
   a third flexible section extending from the first rigid section to the third connector.

10. The electronic device of claim 1, wherein the first antenna module and the second antenna module each include a patch antenna.

11. The electronic device of claim 1, wherein the at least one wireless communication circuit is configured to receive a wireless signal having a frequency in a range of about 6 GHz to 100 GHz through the first antenna module and the second antenna module.

12. An electronic device comprising:
   a housing including at least a part of a lateral surface of the electronic device;
   a printed circuit board (PCB) disposed in the housing;
   at least one wireless communication circuit disposed on the PCB;
   a first antenna module including at least one antenna disposed in a first region inside the housing;
   a second antenna module including at least one antenna disposed in a second region inside the housing;
   a third antenna module including at least one antenna disposed in a third region inside the housing;
   a first flexible printed circuit board (FPCB) connecting the first antenna module to the at least one wireless communication circuit; and
   a second FPCB connecting the second antenna module and the third antenna module to the at least one wireless communication circuit,
   wherein the second FPCB includes:
   a first connector disposed on the PCB and electrically connected to the at least one wireless communication circuit;
   a second connector coupled with a second joint and electrically connected to the second antenna module;
   a third connector coupled with a third joint and electrically connected to the third antenna module; and
   a coupler connecting the first connector, the second connector, and the third connector,
   wherein
   at least a part of a lateral surface of the electronic device includes a conductive region;
   the third antenna module is electrically connected to the conductive region; and the at least one wireless communication circuit is configured to supply power to the conductive region to receive an RF signal.

\* \* \* \* \*